US009064748B2

(12) United States Patent
Haensch et al.

(10) Patent No.: US 9,064,748 B2
(45) Date of Patent: Jun. 23, 2015

(54) GRAPHENE AND NANOTUBE/NANOWIRE TRANSISTOR WITH A SELF-ALIGNED GATE STRUCTURE ON TRANSPARENT SUBSTRATES AND METHOD OF MAKING SAME

(71) Applicant: International Business Machines Corporation, Armonk, NY (US)

(72) Inventors: Wilfried Ernst-August Haensch, Somers, NY (US); Zihong Liu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/323,212

(22) Filed: Jul. 3, 2014

(65) Prior Publication Data
US 2014/0312298 A1 Oct. 23, 2014

Related U.S. Application Data

(60) Division of application No. 14/059,154, filed on Oct. 21, 2013, which is a continuation of application No. 13/286,394, filed on Nov. 1, 2011, now Pat. No. 8,569,121.

(51) Int. Cl.
*H01L 29/78* (2006.01)
*H01L 29/12* (2006.01)
(Continued)

(52) U.S. Cl.
CPC ........ *H01L 29/122* (2013.01); *H01L 29/42364* (2013.01); *H01L 29/42376* (2013.01);
(Continued)

(58) Field of Classification Search
CPC ............ H01L 29/1606; H01L 29/6606; H01L 29/122; H01L 29/41725; H01L 29/41775; H01L 29/0669; H01L 21/0445; H01L 51/0558
USPC ............ 257/24, 29, 40, E51.04; 438/99, 151, 438/299
See application file for complete search history.

(56) References Cited

U.S. PATENT DOCUMENTS

| 5,010,027 A | 4/1991 | Possin et al. |
| 6,699,642 B2 | 3/2004 | Chung et al. |

(Continued)

FOREIGN PATENT DOCUMENTS

| CN | 101488459 A | 7/2009 |
| EP | 0481777 A2 | 4/1992 |

(Continued)

OTHER PUBLICATIONS

English Abstract of CN101488459 A filed by Shengdong, Univ Peking Sz Graduate School, dated Jul. 22, 2009.
(Continued)

*Primary Examiner* — Cheung Lee
*Assistant Examiner* — Stephen Bradley
(74) *Attorney, Agent, or Firm* — Vazken Alexanian; Michael J. Chang, LLC

(57) ABSTRACT

Transistor devices having a self-aligned gate structure on transparent substrates and techniques for fabrication thereof are provided. In one aspect, a method of fabricating a transistor device includes the following steps. A channel material is formed on a transparent substrate. Source and drain electrodes are formed in contact with the channel material. A dielectric layer is deposited on the channel material. A photoresist is deposited on the dielectric layer and developed using UV light exposure through the transparent substrate. A gate metal(s) is deposited on the exposed portions of the dielectric layer and the undeveloped portions of the photoresist. The undeveloped portions of the photoresist are removed along with portions of the gate metal over the source and drain regions to form a gate of the device on the dielectric layer over the channel material which is self-aligned to the source and drain electrodes.

17 Claims, 4 Drawing Sheets

(51) Int. Cl.
*H01L 29/423* (2006.01)
*H01L 29/66* (2006.01)
*H01L 29/778* (2006.01)
*H01L 29/16* (2006.01)
*H01L 21/268* (2006.01)
*H01L 21/283* (2006.01)
*H01L 21/308* (2006.01)
*H01L 29/786* (2006.01)
*H01L 29/06* (2006.01)
*H01L 29/43* (2006.01)

(52) U.S. Cl.
CPC ...... *H01L29/66431* (2013.01); *H01L 29/7781* (2013.01); *H01L 29/1606* (2013.01); *H01L 21/2686* (2013.01); *H01L 21/283* (2013.01); *H01L 21/308* (2013.01); *H01L 29/1608* (2013.01); *H01L 29/66068* (2013.01); *H01L 29/66515* (2013.01); *H01L 29/66742* (2013.01); *H01L 29/78684* (2013.01); *H01L 29/0669* (2013.01); *H01L 29/43* (2013.01)

(56) References Cited

U.S. PATENT DOCUMENTS

| | | | |
|---|---|---|---|
| 6,972,219 | B2 | 12/2005 | Yukawa |
| 7,714,386 | B2 * | 5/2010 | Pesetski et al. ............... 257/347 |
| 8,063,451 | B2 * | 11/2011 | Zhang et al. ................. 257/401 |
| 8,143,670 | B2 * | 3/2012 | Do et al. ...................... 257/332 |
| 2003/0178617 | A1 * | 9/2003 | Appenzeller et al. ........... 257/20 |
| 2007/0026585 | A1 | 2/2007 | Wong et al. |
| 2007/0141736 | A1 | 6/2007 | Van Pieterson et al. |
| 2007/0278518 | A1 * | 12/2007 | Chen et al. .................... 257/192 |
| 2007/0287237 | A1 | 12/2007 | Rockenberger et al. |
| 2008/0299495 | A1 | 12/2008 | Xi et al. |
| 2009/0032804 | A1 * | 2/2009 | Kalburge ........................ 257/24 |
| 2009/0166612 | A1 | 7/2009 | Cain et al. |
| 2009/0253590 | A1 | 10/2009 | Murakoshi et al. |
| 2010/0051922 | A1 | 3/2010 | Hotta et al. |
| 2010/0065988 | A1 | 3/2010 | Hannon et al. |
| 2010/0090198 | A1 | 4/2010 | Li et al. |
| 2010/0155847 | A1 | 6/2010 | Do et al. |
| 2011/0121409 | A1 | 5/2011 | Seo et al. |
| 2011/0165724 | A1 | 7/2011 | Guha et al. |
| 2012/0080658 | A1 | 4/2012 | Yang et al. |
| 2012/0089658 | A1 | 4/2012 | Woo et al. |
| 2012/0181506 | A1 | 7/2012 | Farmer et al. |

FOREIGN PATENT DOCUMENTS

| | | |
|---|---|---|
| EP | 1748477 A2 | 1/2007 |
| GB | 2466495 A | 6/2010 |
| WO | WO0115234 A1 | 3/2001 |
| WO | WO0144867 A1 | 6/2001 |
| WO | WO2007110671 A2 | 10/2007 |

OTHER PUBLICATIONS

Liu et al., "Large-Scale Graphene Transistors with Enhanced Performance and Reliability Based on Interface Engineering by Phenylsilane Self-Assembled Monolayers," Nano Lett. 2011, 11, 523-528 (published Dec. 2010).
Han et al., "Synthesis of Gallium Nitride Nanorods Through a Carbon Nanotube-Confined Reaction," Science, vol. 277 (Aug. 1997).
Guha et al., "Direct synthesis of single crystalline In2O3 nanopyramids and nanocolumns and their photoluminescence properties," Appl. Phy. Lett. 85, 3851 (Oct. 2004).
Watanabe et al., "Fabrication of GaAs Quantum Dots by Modified Droplet Epitaxy," Jpn. J. Appl. Phys., vol. 39, pp. L79-L81 (Feb. 2000).
Farmer et al., "Graphene Field-Effect Transistors with Self-Aligned Gates," Applied Physics Letters, vol. 97, No. 1, 013103-1-013103-3 (published Jul. 2010).
Wang et al., "Scalable Synthesis of Graphene on Patterned Ni and Transfer," IEEE Transactions on Electron Devices, vol. 57, No. 12, pp. 3472-3476 (Dec. 2010).

* cited by examiner

GRAPHENE AND NANOTUBE/NANOWIRE TRANSISTOR WITH A SELF-ALIGNED GATE STRUCTURE ON TRANSPARENT SUBSTRATES AND METHOD OF MAKING SAME

CROSS-REFERENCE TO RELATED APPLICATION(S)

This application is a divisional of U.S. application Ser. No. 14/059,154 filed on Oct. 21, 2013, now U.S. Pat. No. 8,802,514, which is a continuation of U.S. application Ser. No. 13/286,394 filed on Nov. 1, 2011, now U.S. Pat. No. 8,569,121, the disclosures of which are incorporated by reference herein.

STATEMENT OF GOVERNMENT RIGHTS

This invention was made with Government support under Contract number FA8650-08-C-7838 awarded by (DARPA) Defense Advanced Research Projects Agency. the Government has certain rights in this invention.

FIELD OF THE INVENTION

The present invention relates to transistor devices and more particularly, to transistor devices having a self-aligned gate structure on transparent substrates and techniques for fabrication thereof.

BACKGROUND OF THE INVENTION

Transistors used for integrated circuits require minimal parasitic capacitance to maximize the circuit speed and frequency. Each transistor typically includes a source region and a drain region interconnected by a channel and a gate that regulates electron flow through the channel. To minimize parasitic capacitance, traditional silicon metal-oxide semiconductor field effect transistors (MOSFETs) can employ self-aligned gate structures. Specifically, with these structures, the gate is self aligned to the channel and to the source and drain regions. Accordingly, with this configuration, the amount by which the gate overlaps the source and drain regions is at best minimal. By minimizing or eliminating the overlap between the gate and the source and drain regions, the parasitic capacitance between the gate and the source/drain is reduced.

There is currently much interest in the use of carbon-based materials, such as graphene and carbon nanotubes, as a transistor channel material. One challenge for implementation of such carbon-based devices, however, is that there currently exists no practical method to fabricate a self-aligned gate structure with these devices. Therefore, unlike traditional silicon MOSFETs, parasitic capacitance in carbon-based devices is still a concern.

Therefore, techniques for producing carbon-based transistor devices with self-aligned gate structure would be desirable.

SUMMARY OF THE INVENTION

The present invention provides transistor devices having a self-aligned gate structure on transparent substrates and techniques for fabrication thereof. In one aspect of the invention, a method of fabricating a transistor device is provided. The method includes the following steps. A transparent substrate is provided. A channel material is formed on the substrate. Source and drain electrodes are formed in contact with the channel material. A dielectric layer is deposited on the channel material and on the source and drain electrodes. A photoresist is deposited on the dielectric layer. The photoresist is developed using UV light exposure through the transparent substrate, wherein exposure of portions of the photoresist is blocked by the source and drain electrodes. Developed portions of the photoresist are removed exposing portions of the dielectric layer, wherein undeveloped portions of the photoresist remain over the source and drain electrodes. At least one gate metal is deposited on the exposed portions of the dielectric layer and the undeveloped portions of the photoresist. The undeveloped portions of the photoresist are removed along with portions of the gate metal over the source and drain regions, wherein a remaining portion of the gate metal between the source and drain region electrodes forms a gate of the device on the dielectric layer over the channel material which is self-aligned to the source and drain electrodes.

In another aspect of the invention, another method of fabricating a transistor device is provided. The method includes the following steps. A transparent substrate is provided. A channel material is formed on the substrate. Source and drain electrodes are formed in contact with the channel material. A photoresist is deposited on the channel material and on the source and drain electrodes. The photoresist is developed using UV light exposure through the transparent substrate, wherein exposure of portions of the photoresist is blocked by the source and drain electrodes. Developed portions of the photoresist are removed exposing portions of the channel material, wherein undeveloped portions of the photoresist remain over the source and drain electrodes. A dielectric layer is deposited on the channel material and on the undeveloped portions of the photoresist. At least one gate metal is deposited on the dielectric layer. The undeveloped portions of the photoresist are removed along with portions of the gate metal and portions of the dielectric layer over the source and drain regions, wherein a remaining portion of the gate metal between the source and drain region electrodes forms a gate of the device on the dielectric layer over the channel material which is self-aligned to the source and drain electrodes.

In yet another aspect of the invention, a transistor device is provided. The transistor device includes a transparent substrate; a channel material on the substrate; source and drain electrodes in contact with the channel material; a dielectric layer on the channel material and on the source and drain electrodes; and a gate on the dielectric layer over the channel material which is self-aligned to the source and drain electrodes.

A more complete understanding of the present invention, as well as further features and advantages of the present invention, will be obtained by reference to the following detailed description and drawings.

DETAILED DESCRIPTION OF PREFERRED EMBODIMENTS

Provided herein are transistor devices with a self-aligned gate structure fabricated on transparent substrates. FIGS. 1-9 illustrate an exemplary methodology for fabricating such devices.

Figure 1:
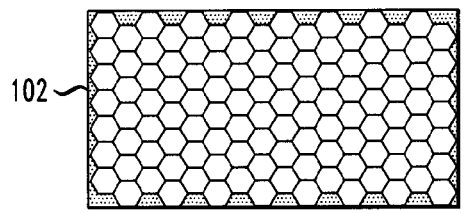
FIG. 1 is a top-down diagram illustrating a channel material, such as a carbon-based material or a nanostructured material, on a transparent substrate according to an embodiment of the present invention.

FIG. 1 is a top-down diagram illustrating a channel material 102 having been formed on a transparent substrate. In the depiction of FIG. 1, the transparent substrate is obscured by the channel material and thus is not visible. However, the transparent substrate is shown in illustrated in subsequent figures.

Figure 2:
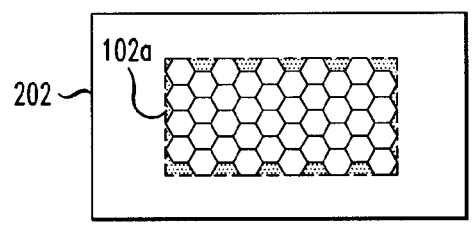
FIG. 2 is a top-down diagram illustrating the channel material having patterned into an active area on the transparent substrate according to an embodiment of the present invention.
Figure 3:
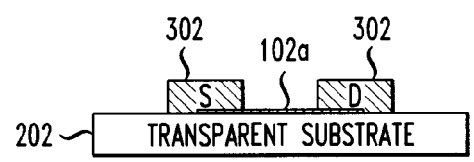
FIG. 3 is a cross-sectional diagram illustrating source and drain electrodes having been formed that are in contact with the channel material according to an embodiment of the present invention.

According to an exemplary embodiment, the channel material is made up of one of a carbon-based material, such as graphene or carbon nanotubes. Graphene is a one atom thick sheet of carbon atoms that are arranged in a honeycomb crystal lattice structure. See, for example, FIGS. 1 and 2. While FIGS. 1 and 2 illustrate graphene as the channel material, as highlighted above, graphene is only one of a number of different exemplary channel materials that may be used in accordance with the present techniques.

By way of example only, when the channel material is formed from graphene, the graphene can be produced/provided in a number of different ways. In one exemplary embodiment, the graphene is first grown on a catalytic metal surface (e.g., on a copper (Cu) or nickel (Ni) film (not shown)) by a chemical vapor deposition (CVD) process. The Cu or Ni film acts as a catalyst for carbon precursor decomposition. An exemplary process for CVD growth of graphemene on a Cu film and for transferring the graphene to a substrate is described, for example, in Liu et al., "Large-Scale Graphene Transistors with Enhanced Performance and Reliability Based on Interface Engineering by Phenylsilane Self-Assembled Monolayers," Nano Lett. 2011, 11, 523-528 (hereinafter "Liu"), the contents of which are incorporated by reference herein.

By way of example only, it is described in Liu that a piece of Cu foil (25 micrometer (μm) thick, Sigma-Aldrich) was placed in a 1 inch diameter quartz furnace tube at low pressure (60 milliTorr (mTorr)). Prior to processing, the system was flushed with 6 sccm of forming gas (5% $H_2$ in Ar) for two hours at a pressure of around 500 mTorr to remove any residual oxygen and water present in the system. The Cu foil was then heated to 875° C. in forming gas (6 sccm, 500 mTorr) and kept at this temperature for 30 minutes to reduce native CuO and increase the Cu grain size. After reduction, the Cu foil was exposed to ethylene (6 sccm, 500 mTorr) at 875° C. for 30 minutes. The result was the formation of a graphene layer on the Cu foil. The sample was cooled down in forming gas (6 sccm, 500 mTorr). PMMA was spin-coated on top of the graphene layer formed on the Cu foil, and the Cu foil was then dissolved in 1 M iron chloride. The remaining graphene/PMMA layer was thoroughly washed with DI water and transferred to the target substrates. Subsequently, the PMMA was dissolved in hot acetone (80° C.) for one hour. The substrates with graphene were rinsed in methanol and dried in a stream of nitrogen.

Alternatively, when the transparent substrate is a silicon carbide (SiC) wafer, then the graphene can be epitaxially grown directly on the substrate using an evaporation process. By way of example only, this process involves heating the SiC wafer (for example, to a temperature of from about 1,150° C. to about 1,450° C.) which causes the silicon atoms on the surface of the SiC wafer to evaporate, leaving behind a carbon-rich surface arranged in one or more graphene layers. See, for example, U.S. Patent Application Publication No. 2010/0065988 A1 filed by Hannon et al., entitled "Method for Preparation of Flat Step-Free Silicon Carbide Surfaces," the contents of which are incorporated by reference herein.

When the channel material is formed from carbon nanotubes, the carbon nanotubes can be deposited as an array on the surface of the transparent substrate from a solution using, for example, a spin-on coating process. The carbon nanotubes can also be grown in a manner similar to the CVD growth process described for graphene above. Namely, as is known in the art, to begin the nanotube CVD growth process a substrate having a layer of metal catalyst particles, such as iron, nickel or cobalt particles is provided. The diameters of the nanotubes that are to be grown are related to the size of the metal particles. The substrate is then heated to a temperature of from about 500° C. to about 800° C. To initiate growth of the nanotubes, two gases are introduced into the ambient, i.e., a process gas (e.g., ammonia, nitrogen or hydrogen) and a carbon-containing gas (e.g., acetylene, ethylene, ethanol or methane). The nanotubes form at the site of the metal catalyst particles.

Alternatively, according to another exemplary embodiment, the channel material can include a semiconducting nanostructured material such as one or more of nanowires, nanorods, nanocolumns and quantum dots. As highlighted above, in addition to carbon-based materials, the channel material may be formed from nanowires. The term "nanowires," as used herein refers to any rod-like structures having a diameter of between about five nanometers (nm) and about 200 nm, and a length of between about 0.1 μm and about 100 μm, e.g., between about three μm and about 30 μm. According to the present teachings, the nanowires are formed from a semiconductor material, such as silicon, germanium and silicon-germanium. Nanowire arrays can be formed, for example, using a vapor-liquid-solid (VLS)-CVD growth technique. With VLS-CVD, a catalyst (for example, gold film) is deposited on a substrate. The substrate/catalyst is inserted into a CVD system to achieve nanowire growth. The environment in which the nanowire growth is carried out can be tailored to dictate the composition of the nanowires produced. By way of example only, the use of a silane ($SiH_4$)-containing ambient will result in silicon nanowire growth. Further, the addition of n- or p-type dopants into the ambient can result in n-doped or p-doped nanowire growth, if desired. For a detailed description of nanowire formation, see, for example, U.S. application Ser. No. 11/494,195, entitled "Techniques for Use of Nanotechnology in Photovoltaics," filed on Jul. 27, 2006, the contents of which are incorporated by reference herein. Nanowire arrays produced in this manner may then be transferred to the transparent substrate.

Nanorods are a nanostructured material having an aspect ratio of length to width of from about 3 to about 5. A nanorod synthesis technique is described, for example, in Han et al., "Synthesis of Gallium Nitride Nanorods Through a Carbon Nanotube-Confined Reaction," Science, vol. 277 (August 1997), the contents of which are incorporated by reference herein. Nanocolumns are described, for example, in Guha et al., "Direct synthesis of single crystalline $In_2O_3$ nanopyramids and nanocolumns and their photoluminescence properties," Appl. Phy. Lett. 85, 3851 (2004), the contents of which are incorporated by reference herein.

Quantum dots, as known in the art, are semiconductor materials with electrical characteristics closely related to the size and shape of the individual crystal. Quantum dots can be assembled into a nanofilm. Quantum dots may be fabricated using an advanced epitaxy process. See, for example, Watanabe et al., "Fabrication of GaAs Quantum Dots by Modified Droplet Epitaxy," Jpn. J. Appl. Phys., vol. 39, pp. L79-L81 (2000), the contents of which are incorporated by reference herein.

The channel material 102 is then patterned to form an active area 102a on the transparent substrate 202. See FIG. 2. As highlighted above, the illustration of graphene as the channel material in FIGS. 1 and 2 is done merely for exemplary purposes. According to the present techniques, the transparent substrate has to be transparent to ultraviolet (UV) light that will later in the process be used for exposing a photoresist during patterning steps used in gate formation (see below). Thus, in general, any substrate transparent to UV light may be used in conjunction with the present teachings. By way of example only, as highlighted above, a SiC substrate (which is inherently transparent) that can be used to directly grow graphene on a surface thereof may be employed. Other commercially glass or transparent flexible plastic substrates may be used. For instance, flexible plastic substrates are available from Teijin DuPont Films Limited, e.g., the Teonex® polyethylene naphthalate (PEN) film or polyethylene terephthalate (PET) film.

The channel material may be patterned into active area 102a by first patterning a mask (not shown) over the channel material 102 with the location and footprint of active area 102a. $O_2$ plasma reactive ion etching (RIE) can then be used to remove portions of the channel material not covered by the mask and outside of the active area. The mask is removed. The particular parameters for performing this patterning step would be apparent to one of ordinary skill in the art and thus are not described further herein.

Next, source and drains electrodes 302 (labeled "S" and "D," respectively) are formed in contact with the channel material. See FIG. 3. According to an exemplary embodiment, source and drain electrodes 302 are formed by first depositing a suitable metal over the transparent substrate and channel material, and then patterning the metal using standard lithography techniques to form source and drains electrodes 302. Suitable metals include, but are not limited to, gold (Au), platinum (Pt) and/or nickel (Ni). Alternatively, a stencil can be patterned to cover areas of the transparent substrate and channel material in which the source and drain electrodes 302 will not be formed. The given metal(s) (e.g., Au, Pt and/or Ni) can be deposited over the stencil. The stencil can then be removed using standard processes, removing the excess metal with it. The result is source and drains electrodes 302.

Figure 4:
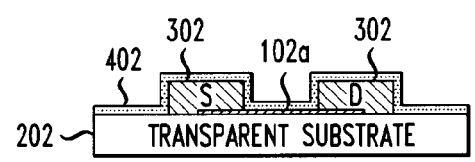
FIG. 4 is a cross-sectional diagram illustrating a dielectric layer having been deposited onto exposed top surfaces of the channel material, the transparent substrate and the source and drains electrodes according to an embodiment of the present invention.

As shown in FIG. 4, a dielectric layer 402 is deposited onto the structure coating the exposed top surfaces of the channel material, the transparent substrate 202 and the source and drains electrodes 302. The dielectric layer 402 will serve as a gate dielectric of the device, separating a gate of the transistor (to be formed as described below) from a channel of the transistor. According to an exemplary embodiment, the dielectric layer 402 includes, but is not limited to, one or more of hafnium oxide ($HfO_2$), aluminum oxide ($Al_2O_3$) and silicon oxide ($SiO_2$) deposited using, e.g., atomic layer deposition (ALD). sputtering or plasma enhanced chemical vapor deposition (PECVD). Dielectric layer 402 is preferably a very thin layer so as to maximize the gate capacitance and enhance the electrostatic control of the transistors. By way of example only, dielectric layer 402 is formed having a thickness of from about 1 nm to about 50 nm, e.g., about 10 nm.

Figure 5:
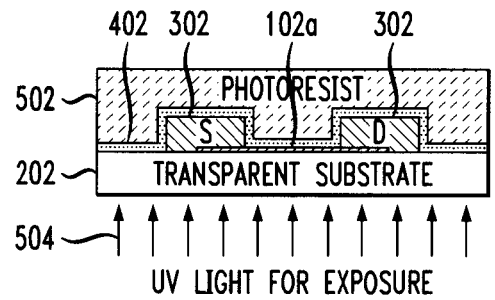
FIG. 5 is a cross-sectional diagram illustrating a positive photoresist having been deposited over the dielectric layer and development of the photoresist using UV light exposure through the transparent substrate according to an embodiment of the present invention.

To begin the gate fabrication process, a positive photoresist 502 is then blanket deposited over the dielectric layer 402. See FIG. 5. Photoresist 502 may be deposited in this manner using a spin-on deposition process. Any conventional photoresist material may be employed. Next, as indicated by arrows 504, unlike with conventional fabrication techniques, the photoresist 502 is then exposed (using UV light) through the transparent substrate 202, i.e., from the backside of the structure. By contrast, conventional processes would involve exposing the photoresist from the top of the structure, i.e., from an opposite side to what is shown in FIG. 5.

As is known to those of skill in the art, the exposure of positive photoresist material to UV light will develop those areas of the photoresist exposed to the UV light. Typical UV lasers used in lithography systems include the Krypton fluoride laser at 248-nm wavelength and the argon fluoride laser at 193-nm wavelength. The exposure duration depends on the specific photoresist being employed. A typical exposure duration is from about 5 seconds to about 60 seconds. The "developed" portions of the photoresist can then be easily removed using a developer solution, e.g., tetramethylammonium hydroxide (TMAH), selective to the unexposed or undeveloped portions of the photoresist. Advantageously, with the present fabrication flow, since the exposure is being done from a backside of the structure, through the transparent substrate, certain portions of the photoresist 502 are blocked from exposure to the UV light by the source and drain electrodes 302. These portions of the photoresist blocked by the source and drain electrodes 302 (these portions are shown as portions 602 in FIG. 6, described below) are self-aligned to an area over the channel material in which the gate will be formed. The UV light can penetrate the thin dielectric layer.

Figure 6:
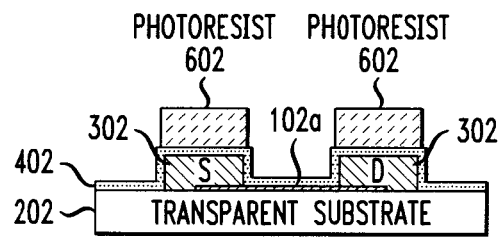
FIG. 6 is a cross-sectional diagram illustrating portions of the photoresist that remain over the source and drain electrodes once the developed portions of the photoresist have been removed according to an embodiment of the present invention.

Namely, as shown in FIG. 6, once the developed portions of the photoresist are removed (as described above), i.e., the photoresist is patterned, the remaining portions 602 of the photoresist remain over the source and drain electrodes 302. These portions 602 of the photoresist will mask the source and drain electrodes 302 during gate metal deposition and can be used (as described below) to lift-off the excess gate metal.

Figure 7:
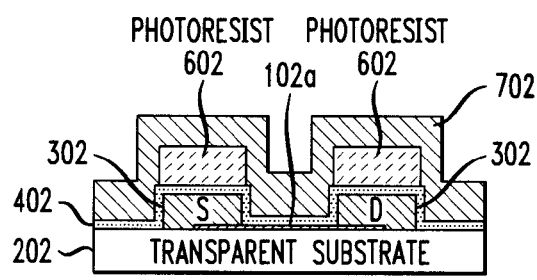
FIG. 7 is a cross-sectional diagram illustrating a gate metal (s) having been blanket deposited onto exposed portions of the dielectric layer and on the remaining portions of the photoresist according to an embodiment of the present invention.

As shown in FIG. 7, a gate metal(s) 702 is blanket deposited onto the exposed portions of the dielectric layer 402 and on the portions 602 of the patterned photoresist. Any suitable gate metal or combination of metals may be employed. By way of example only, gate metal 702 may include Au, Cu and/or aluminum (Al) deposited using, e.g., thermal evaporation. According to an exemplary embodiment, gate metal 702 is made up of a plurality of distinct metal layers deposited as a stack. For instance, a layer of Au (e.g., having a thickness of about 5 nm) may be deposited, e.g., using thermal evaporation, followed by a layer of Al (e.g., having a thickness of about 40 nm) deposited by the same method.

A lift-off process is then used to remove the portions 602 of the photoresist and with them portions of the overlying metal layer 702. See FIG. 8. According to an exemplary embodiment, the lift-off process involves leaving the wafer in a hot acetone at about 80° C. for a duration of from about 30 minutes to about 1 hour or in an N-Methylpyrrolidone (NMP) solution at room temperature for a duration of about 1 hour, and then rinsing the wafer with copious acetone/NMP and isopropanol and deionized water. The result is gate 802 (labeled "G"). Advantageously, since the photoresist portions 602 (now removed) were aligned with the source and drain electrodes 302, portions of the gate metal 702 over the source and drain electrodes 302 were also removed by the above-described lift-off process. Accordingly, the portion of metal layer 702 that is gate 802 is self-aligned with the source and drain electrodes 302. See FIG. 8.

As is apparent from the above-described process flow and associated figures, the source and drain electrodes 302 of the transistor device are interconnected by the channel material (which serves as a channel of the transistor device). The gate 802, which is separated from the channel by the dielectric layer 402, will serve to regulate electron flow through the channel.

Figure 8:
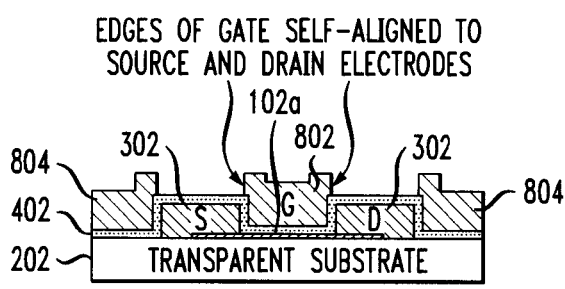
FIG. 8 is a cross-sectional diagram illustrating a lift-off process having been used to remove portions of the gate metal from over the source and drain electrodes, thus forming a gate according to an embodiment of the present invention.
Figure 9:
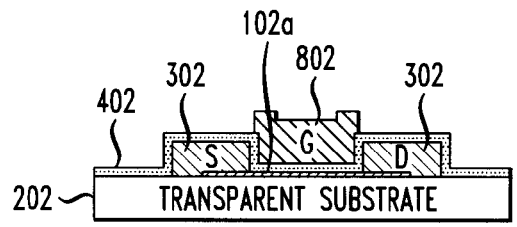
FIG. 9 is a cross-sectional diagram illustrating an optional step to remove excess gate metal according to an embodiment of the present invention.
Figure 10:
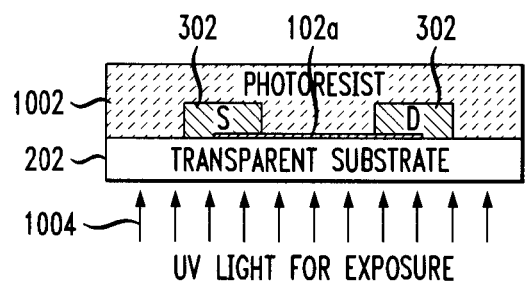
FIG. 10 is a cross-sectional diagram illustrating a positive photoresist having been deposited over the channel material/the source and drains electrodes and development of the photoresist using UV light exposure through the transparent substrate according to an embodiment of the present invention.

Portions 804 of the metal layer 702 will also remain to the outer sides of the source and drain electrodes 302 as shown in FIG. 8. Optionally, these portions 804 (and underlying portions of the dielectric layer 402) can be removed, if desired, using standard lithography and etching techniques. See FIG. 9. For instance, the removal of the outer portion of the metal (portions 804) and the underlying dielectric is fully dependent on the specific application of the devices, e.g., if the devices are to be used in an integrated circuit and to be connected in a multi-level device architecture, this removal might not be necessary since the next layer will cover all of these outer portions. However, if only one layer of devices exist in the circuits, the device here might have to be connected to others through interconnects on this same level, and the outer portion of the metal 804 then will have to be removed. This removal process could be done by a photoresist patterning and metal wet etching process.

An alternative process flow is now provided that is similar to the process flow of FIGS. 1-9, except that the photoresist is deposited and developed before the dielectric and gate are formed. This alternative process flow is now described by way of reference to FIGS. 10-14. The beginning steps are the same as those described in conjunction with the description of FIGS. 1-3, above. Thus, description of the process will begin with the structure shown in FIG. 3.

Proceeding from FIG. 3 to FIG. 10, a positive photoresist 1002 is blanket deposited on the channel material and the source and drain electrodes 302. See FIG. 10. Photoresist 1002 may be deposited in this manner using a spin-on deposition process. Any conventional photoresist material may be employed. Next, as indicated by arrows 1004, the photoresist 1002 is then exposed (using UV light) through the transparent substrate 202, i.e., from the backside of the structure.

As highlighted above, typical UV lasers used in lithography systems include the Krypton fluoride laser at 248-nm wavelength and the argon fluoride laser at 193-nm wavelength. The exposure duration depends on the specific photoresist being employed, with a typical exposure duration being from about 5 seconds to about 60 seconds. The "developed" portions of the photoresist can then be easily removed using a developer solution, e.g., TMAH, selective to the unexposed or undeveloped portions of the photoresist. Advantageously, with the present fabrication flow, since the exposure is being done from a backside of the structure, through the transparent substrate, certain portions of the photoresist 1002 are blocked from exposure to the UV light by the source and drain electrodes 302. These portions of the photoresist blocked by the source and drain electrodes 302 (these portions are shown as portions 1102 in FIG. 11, described below) are self-aligned to an area over the channel material in which the gate will be formed.

Further, in contrast to the first process flow presented above, in this case, the gate dielectric has not yet been deposited. Thus, the UV light does not have an extra layer (i.e., the dielectric layer) to penetrate during the exposure step and the dielectric layer (formed later in the process, see below) can be made thicker if so desired.

Figure 11:
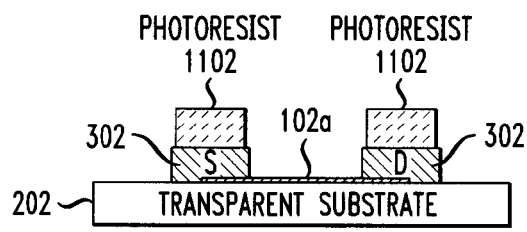
FIG. 11 is a cross-sectional diagram illustrating portions of the photoresist that remain over the source and drain electrodes once the developed portions of the photoresist have been removed according to an embodiment of the present invention.

As shown in FIG. 11, once the developed portions of the photoresist are removed (as described above), i.e., the photoresist is patterned, the remaining portions 1102 of the photoresist remain over the source and drain electrodes 302. These portions 1102 of the photoresist will mask the source and drain electrodes 302 during gate metal deposition and can be used (as described below) to lift-off the excess gate metal and underlying dielectric.

Figure 12:
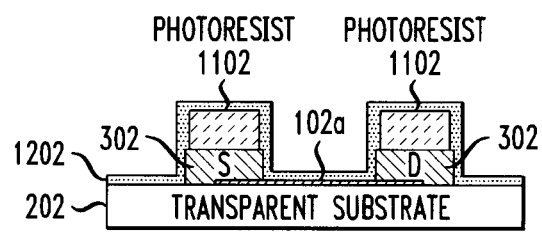
FIG. 12 is a cross-sectional diagram illustrating a dielectric layer having been deposited onto exposed surfaces of the channel material, the remaining portions of the photoresist, the transparent substrate and the source and drains electrodes according to an embodiment of the present invention.

As shown in FIG. 12, a dielectric layer 1202 is deposited onto the structure coating the exposed surfaces of the channel material, the portions 1102 of the photoresist, the transparent substrate 202 and the source and drains electrodes 302. The dielectric layer 1202 will serve as a gate dielectric of the device, separating a gate of the transistor (to be formed as described below) from a channel of the transistor. Suitable dielectric materials and deposition processes were described above. By contrast with the first process flow, in this case, since the photoresist has already been developed, the dielectric layer 1202 can be thicker than dielectric layer 402 (see above), if so desired. By way of example only, dielectric layer 1202 is formed having a thickness of from about 1 nm to about 100 nm, e.g., about 50 nm.

Figure 13:
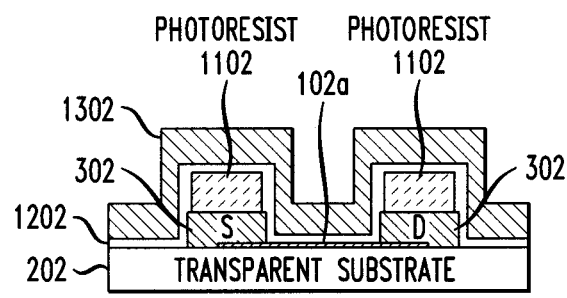
FIG. 13 is a cross-sectional diagram illustrating a gate metal(s) having been blanket deposited onto the dielectric layer according to an embodiment of the present invention.

As shown in FIG. 13, a gate metal(s) 1302 is blanket deposited onto the dielectric layer 1202. Suitable gate metals, configurations (e.g., a multi-layer stack) and deposition processes were described above.

A lift-off process is then used to remove the portions 1102 of the photoresist and with them portions of the overlying dielectric layer 1202 and metal layer 1302. See FIG. 14. Exemplary lift-off parameters were provided above. The result is gate 1402 (labeled "G"). Advantageously, since the photoresist portions 1102 (now removed) were aligned with the source and drain electrodes 302, portions of the gate metal 1302 over the source and drain electrodes 302 were also removed by the above-described lift-off process. Accordingly, the portion of metal layer 1302 that is gate 1402 is self-aligned with the source and drain electrodes 302. See FIG. 14.

As is apparent from the above-described process flow and associated figures, the source and drain electrodes 302 of the transistor device are interconnected by the channel material (which serves as a channel of the transistor device). The gate 1402, which is separated from the channel by the dielectric layer 1202, will serve to regulate electron flow through the channel.

Figure 14:
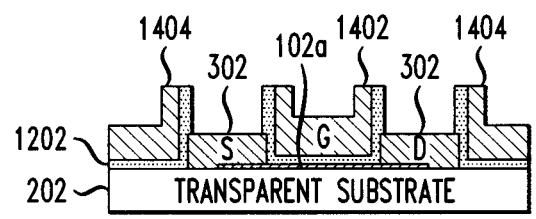
FIG. 14 is a cross-sectional diagram illustrating a lift-off process having been used to remove portions of the gate metal and the dielectric layer from over the source and drain electrodes, thus forming a gate according to an embodiment of the present invention.
Figure 15:
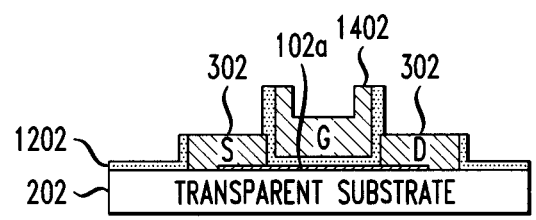
FIG. 15 is a cross-sectional diagram illustrating an optional step to remove excess gate metal according to an embodiment of the present invention.

Portions 1404 of the metal layer 1302 will also remain to the outer sides of the source and drain electrodes 302 as shown in FIG. 14. Optionally, these portions 1404 (and underlying portions of the dielectric layer 1202) can be removed, if desired, using standard lithography and etching techniques. See FIG. 15. For instance, the removal of the outer portion of the metal (portions 1404) and the underlying dielectric is fully dependent on the specific application of the devices, e.g., if the devices are to be used in an integrated circuit and to be connected in a multi-level device architecture, this removal might not be necessary since the next layer will cover all of these outer portions. However, if only one layer of devices exist in the circuits, the device here might have to be connected to others through interconnects on this same level, and the outer portion of the metal 1404 then will have to be removed. This removal process could be done by a photoresist patterning and metal wet etching process.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A transistor device, comprising:
a transparent substrate;
a channel material on the substrate;
source and drain electrodes over, and in contact with, the channel material;
a dielectric layer on the channel material and on the source and drain electrodes; and
a gate on the dielectric layer over the channel material which is self-aligned to the source and drain electrodes, wherein the gate is present between the source and drain electrodes, wherein portions of gate metal remain present on outer sides of the source and drain electrodes and are separated from the source and drain electrodes by the dielectric layer, such that top surfaces of the source and drain electrodes are accessible, and wherein the gate and the portions of the gate metal on the outer sides of the source and drain electrodes are separated by a gap present over the top surfaces of the source and drain electrodes.

2. The device of claim 1, wherein the transparent substrate comprises a glass substrate, or a flexible plastic substrate.

3. The device of claim 1, wherein the transparent substrate comprises a silicon carbide wafer.

4. The device of claim 1, wherein the channel material comprises a carbon-based material.

5. The device of claim 4, wherein the carbon-based material comprises graphene.

6. The device of claim 4, wherein the carbon-based material comprises carbon nanotubes.

7. The device of claim 1, wherein the channel material comprises a nanostructured material selected from the group consisting of nanowires, nanorods, nanocolumns and quantum dots.

8. The device of claim 1, wherein the source and drain electrodes are present over, and in direct contact with, both the channel material and the transparent substrate, such that the source and drain electrodes cover opposite ends of the channel material and contact a surface of the transparent substrate beneath the channel material.

9. The device of claim 1, wherein the dielectric layer is present on, and in direct contact with, each of the channel material, the source and drain electrodes, and the transparent substrate.

10. The device of claim 1, wherein the dielectric layer has a thickness that permits UV light to pass therethrough.

11. The device of claim 1, wherein only the dielectric layer is present on, and in direct contact with, the top surfaces of the source and drain electrodes.

12. The device of claim 1, wherein the dielectric layer comprises one or more of hafnium oxide, aluminum oxide and silicon oxide.

13. The device of claim 1, wherein the dielectric layer has a thickness of from about 1 nanometer to about 50 nanometers.

14. The device of claim 1, wherein the source and drain electrodes each comprise one or more of gold, platinum or nickel.

15. The device of claim 1, wherein the gate metal comprises one or more of gold copper and aluminum.

16. The device of claim 1, wherein the dielectric layer is present on, and completely covers, both sides of the gate adjacent to the source and drain electrodes, and wherein the dielectric layer is absent from the top surfaces of the source and drain electrodes.

17. The device of claim 1, wherein the transparent substrate comprises a flexible plastic substrate.

* * * * *